(12) United States Patent
Tani et al.

(10) Patent No.: US 9,850,427 B2
(45) Date of Patent: Dec. 26, 2017

(54) PHOSPHOR SHEET

(71) Applicant: DEXERIALS CORPORATION, Tokyo (JP)

(72) Inventors: Hirofumi Tani, Fukaya (JP); Tsuneo Kusunoki, Utsunomiya (JP); Masahide Daimon, Kanuma (JP); Yasushi Ito, Utsunomiya (JP); Tomomitsu Hori, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 517 days.

(21) Appl. No.: 14/605,356

(22) Filed: Jan. 26, 2015

(65) Prior Publication Data

US 2015/0197689 A1 Jul. 16, 2015

Related U.S. Application Data

(63) Continuation of application No. PCT/JP2013/069289, filed on Jul. 16, 2013.

(30) Foreign Application Priority Data

Jul. 25, 2012 (JP) ................. 2012-165056

(51) Int. Cl.
| | |
|---|---|
| *C09K 11/77* | (2006.01) |
| *C08L 53/02* | (2006.01) |
| *F21V 9/00* | (2015.01) |
| *F21V 9/16* | (2006.01) |
| *C08F 2/48* | (2006.01) |
| *C09K 11/02* | (2006.01) |

(Continued)

(52) U.S. Cl.
CPC ............ *C09K 11/7734* (2013.01); *C08F 2/48* (2013.01); *C09K 11/025* (2013.01);
(Continued)

(58) Field of Classification Search
CPC ... H01L 33/502; H01L 33/501; H01L 33/505; C08L 53/025; C09K 11/02; C09K 11/025; C09K 11/7731
See application file for complete search history.

(56) References Cited

U.S. PATENT DOCUMENTS

| | | | |
|---|---|---|---|
| 2006/0255713 A1 | 11/2006 | Kondo et al. | |
| 2007/0125984 A1 | 6/2007 | Tian et al. | |

(Continued)

FOREIGN PATENT DOCUMENTS

| | | | |
|---|---|---|---|
| JP | H06-65570 A | 3/1994 | |
| JP | H09-272866 A | 10/1997 | |

(Continued)

*Primary Examiner* — Jospeh L Williams
(74) *Attorney, Agent, or Firm* — Oliff PLC

(57) ABSTRACT

In order to suppress the chromaticity shift and corrosion associated with the deterioration of a sulfide phosphor particle, this phosphor sheet is produced using a phosphor particle-containing resin composition which comprises: covered phosphor particles; polymerizable compound; and a polymerization initiator. The covered phosphor particles are obtained by covering phosphor particles with silicon dioxide films, wherein among the phosphor particles, at least sulfide phosphor particles are covered with silicon dioxide films that contain a metal oxide powder. Thus, the phosphor sheet can be inhibited from emitting a sulfur-based gas, and exhibits a minimized chromaticity shift, even when the phosphor sheet is present in such a manner that the edge of the phosphor layer of the sheet is in an exposed state.

33 Claims, 7 Drawing Sheets

(51) Int. Cl.
   *H01L 25/075* (2006.01)
   *F21K 9/64* (2016.01)
   *H01L 33/50* (2010.01)
   *G02F 1/1335* (2006.01)
   *F21Y 101/00* (2016.01)
   *F21Y 115/10* (2016.01)

(52) U.S. Cl.
   CPC ...... *C09K 11/7731* (2013.01); *C09K 11/7733* (2013.01); *F21K 9/64* (2016.08); *H01L 25/0753* (2013.01); *H01L 33/501* (2013.01); *H01L 33/505* (2013.01); *F21Y 2101/00* (2013.01); *F21Y 2115/10* (2016.08); *G02F 2001/133614* (2013.01); *H01L 33/504* (2013.01); *H01L 2224/48091* (2013.01); *H01L 2924/0002* (2013.01); *Y10T 428/256* (2015.01)

(56) References Cited

U.S. PATENT DOCUMENTS

2008/0241590 A1* 10/2008 Kim ............. C09K 11/025 428/690

2014/0029238 A1* 1/2014 Ito ............. F21V 9/00 362/84
2014/0097461 A1* 4/2014 Ito ............. C09K 11/02 257/98
2014/0293609 A1* 10/2014 Daimon ......... H01L 33/504 362/293

FOREIGN PATENT DOCUMENTS

| | | |
|---|---|---|
| JP | 2005-108635 A | 4/2005 |
| JP | 2006-188700 A | 7/2006 |
| JP | 2006-265326 A | 10/2006 |
| JP | 2007-005098 A | 1/2007 |
| JP | 2007-023221 A | 2/2007 |
| JP | 2007-091874 A | 4/2007 |
| JP | 2008-031190 A | 2/2008 |
| JP | 2008-041706 A | 2/2008 |
| JP | 2009-526089 A | 7/2009 |
| JP | 2009-283438 A | 12/2009 |
| JP | 2009-293441 A | 12/2009 |
| JP | 2011-195727 A | 10/2011 |
| WO | 2012/077656 A1 | 6/2012 |
| WO | 2013/021990 A1 | 2/2013 |

* cited by examiner 30a, 30b

Prior art

PHOSPHOR SHEET

CROSS-REFERENCE TO RELATED APPLICATIONS

This application is a continuation of International Application No. PCT/JP2013/69289, filed on Jul. 16, 2013, which claims priority to Japan Patent Application No. 2012-165056, filed on Jul. 25, 2012. The contents of the prior applications are herein incorporated by references in their entireties.

TECHNICAL FIELD

The present invention generally relates to a phosphor sheet, including a phosphor layer formed of a phosphor-containing resin composition including a composition for film formation and a powdery phosphor particle that emits fluorescence when irradiated with excitation light.

BACKGROUND ART

Heretofore, a thin liquid crystal display uses a backlight that illuminates a liquid crystal panel from the back toward the front face of the liquid crystal panel, and is broadly classified into an edge lighting system and a direct lighting system depending on structures of the backlight.

In the edge lighting system, incident light from the side surface of a light guide plate is propagated to the inside of the light guide plate, and then, the light is extracted from the upper surface of the light guide plate. On the other hand, in the direct lighting system, for example, a plurality of fluorescent tube lamps, such as, cold cathode fluorescent lamps (CCFLs) or the like are provided on a substrate to perform surface emission on the whole surface (see Patent Literature 1).

In recent years, from the viewpoints of increasing the size, decreasing the thickness, decreasing the weight, extending the lifetime of the liquid crystal display, and improving moving image properties by controlling flashing, there has been employed the direct lighting system in which a plurality of light-emitting diodes (LEDs) are provided on a substrate to perform surface emission.

A first method using the LED is a method involving providing LEDs emitting colored light of three colors (R, G, and B) and turning on the LEDs simultaneously to combine the light of three colors to generate white light.

Furthermore, a second method using the LED is a method involving surrounding, for example, a blue light-emitting LED chip with resin containing phosphor particles so as to convert blue light into white light.

Moreover, a third method using the LED is a method of which light from a blue light-emitting diode (blue LED) is irradiated to a phosphor sheet obtained by dispersing a powdery red phosphor particle that emits red fluorescence when irradiated with blue light and a green phosphor particle that emits green fluorescence when irradiated with blue light in a resin material having a excellent property in visible light transmittance to emit red light and green light; and the red light and green light with blue light are mixed to generate white light (see Patent Literatures 2 and 3).

Some phosphor particles are fragile against oxygen or water vapor. When the phosphor particles are exposed to oxygen or water vapor, their properties deteriorate to cause luminance or chromaticity unevenness. For example, a sulfide phosphor particle easily deteriorates by an environment, such as, water or oxygen and significantly deteriorates particularly under high-temperature and high-humidity conditions. Deterioration of the sulfide phosphor particle reduces the lifetime of an LED element because a sulfur component in the phosphor particles itself causes corrosion of a metal at a current-carrying portion in the LED element to induce a decrease in light extraction efficiency in the LED element, break of an energization portion, and the like.

In order to extend the lifetime of an LED element using a sulfide phosphor particle, there have been proposed a method involving forming a protective layer formed of a silicon compound or the like on the phosphor particle (see Patent Literature 4), a method involving adding an adsorbent for a sulfur-based gas to a resin for sealing an LED (see Patent Literature 5), and a method involving performing sealing with an oxygen or water-vapor barrier film to extend its lifetime (see Patent Literatures 6 and 7).

However, even when the surface of the phosphor particle is coated as described in Patent Literature 4, chromaticity shift or corrosion due to deterioration of the sulfide phosphor particle cannot be suppressed sufficiently. Furthermore, in the technologies of Patent Literatures 5 to 7, the phosphor particle itself is not protected, and deterioration of the phosphor particle during long-term use is unavoidable.

CITATION LIST

Patent Literature

[PTL 1] JP 2005-108635 A
[PTL 2] JP 2009-283438 A
[PTL 3] JP 2008-041706 A
[PTL 4] JP 2007-023221 A
[PTL 5] JP 2008-031190 A
[PTL 6] JP 2007-005098 A
[PTL 7] JP 2009-293441 A

SUMMARY OF THE INVENTION

Technical Problem

The present invention has been proposed in view of such conventional circumstances and provides a phosphor sheet that can suppress chromaticity shift or corrosion due to deterioration of a sulfide phosphor particle.

Means to Solve the Problems

The inventors of the present invention have made intensive studies, and as a result, have found that the object described above can be achieved by coating a phosphor which is a particle of phosphor material with a silicon dioxide film, and coating at least a sulfide phosphor particle among the phosphor particles with a silicon dioxide film including metal oxide powders, thus completing the present invention.

That is, according to one embodiment of the present invention, there is provided a phosphor sheet, the phosphor sheet comprising a phosphor layer; wherein the phosphor layer includes a sheet-shaped resin, and a coated sulfide phosphor particle obtained by coating a sulfide phosphor particle (made of particles of a sulfide fluorescent substance) with a silicon dioxide film, the silicon dioxide film of the coated sulfide phosphor particle containing powders of a sulfur-atom containing gas adsorbent made of a metal oxide, the sheet-shaped resin containing powders of the coated sulfide phosphor particle, and the coated sulfide phosphor particle emits light when irradiated with excitation light.

The present invention is the phosphor sheet, wherein the sheet-shaped resin includes a coated non-sulfide phosphor particle obtained by coating a non-sulfide phosphor particle including particles of a non-sulfide fluorescent substance, which is free of sulfur atoms, with a silicon dioxide film.

The present invention is the phosphor sheet wherein the silicon dioxide film of the coated non-sulfide phosphor particle contains the powders of the sulfur-atom containing gas adsorbent.

The present invention is the phosphor sheet further including a transparent base material layer disposed on each of an opposed pair of side surfaces of the phosphor layer, where each respective transparent base layers provided so as to be brought into contact with one respective of the side surfaces of the phosphor layer.

The present invention is the phosphor sheet, the phosphor layer having an exposed side surface.

The present invention is the phosphor sheet, wherein the phosphor layer has an outer periphery sealed by a frame so as to prevent the side surfaces of the phosphor layer from being exposed.

The present invention is the phosphor sheet, wherein zinc oxide is used as the metal oxide.

The present invention is the phosphor sheet, wherein the coated sulfide phosphor particle emits green light when irradiated with blue light, and wherein the non-sulfide fluorescent substance emits red light when irradiated with blue light.

The present invention is the phosphor sheet, wherein the sulfide fluorescent substance is $(Sr_xM_{1-x-y})Ga_2S_4:Eu_y$, where M represents any one of Ca, Mg, and Ba, and x and y satisfy relationships of $0 \leq x \leq 1$ and $0 < y < 0.05$, respectively.

The present invention is the phosphor sheet, wherein the non-sulfide fluorescent substance is $(BaSr)_3SiO_5:Eu$.

The present invention is the phosphor sheet, wherein the sheet-shaped resin is formed by curing a sheet-shaped phosphor particle-containing resin composition containing a polymerizable compound through a polymerization reaction of the polymerizable compound.

The present invention is the phosphor sheet, wherein the polymerizable compound includes a photocurable acrylate, and the phosphor particle-containing resin composition contains a photopolymerization initiator.

The present invention is a phosphor particle-containing resin composition, including a polymerizable compound; and a coated sulfide phosphor particle obtained by coating a sulfide phosphor particle (made of particles of a sulfide fluorescent substance) with a silicon dioxide film, the silicon dioxide film of the coated sulfide phosphor particle containing powders of a sulfur-atom containing gas adsorbent made of a metal oxide, wherein the polymerizable compound includes powders of the coated sulfide phosphor particle.

The present invention is the phosphor particle-containing resin composition, wherein the polymerizable compound contains a coated non-sulfide phosphor particle obtained by coating particles of a non-sulfide fluorescent substance, which is free of sulfur atoms, with a silicon dioxide film.

The present invention is the phosphor particle-containing resin composition, wherein the silicon dioxide film of the coated non-sulfide phosphor particle contains the powders of the sulfur-atom containing gas adsorbent.

The present invention is the phosphor particle-containing resin composition, wherein zinc oxide is used as the metal oxide.

The present invention is the phosphor particle-containing resin composition according to claim 13, wherein the sulfide phosphor particle is $(Sr_xM_{1-x-y})Ga_2S_4:Eu_y$, where M represents any one of Ca, Mg, and Ba, and x and y satisfy relationships of $0 \leq x \leq 1$ and $0 < y < 0.05$, respectively.

The present invention is the phosphor particle-containing resin composition, wherein the non-sulfide phosphor particle is $(BaSr)_3SiO_5:Eu$.

The present invention is the phosphor particle-containing resin composition, wherein the polymerizable compound contains a photocurable acrylate, and the polymerizable compound contains a photopolymerization initiator.

The present invention is a white light-emitting apparatus, including a blue light-emitting element covered with a resin, the resin for covering the light-emitting element includes powders of a coated sulfide phosphor particle obtained by coating a sulfide phosphor particle with a silicon dioxide film, the silicon dioxide film of the coated sulfide phosphor particle containing powders of a sulfur-atom containing gas adsorbent made of a metal oxide, wherein the sulfide phosphor particle are particles of a sulfide fluorescent substance and emit green light when irradiated with blue light. The resin may further include powders of a coated non-sulfide phosphor particle obtained by coating a non-sulfide phosphor particle with a silicon dioxide film, the non-sulfide phosphor particle including particles of a non-sulfide fluorescent substance free of sulfur atoms and emitting red light when irradiated with blue light, and wherein the white light emitting apparatus emits white light by light emission of the blue-light-emitting element.

The present invention is the white light-emitting apparatus, wherein zinc oxide is used as the metal oxide.

The present invention is the white light-emitting apparatus, wherein the sulfide phosphor particle includes $(Sr_xM_{1-x-y})Ga_2S_4:Eu_y$, where M represents any one of Ca, Mg, and Ba, and x and y satisfy relationships of $0 \leq x \leq 1$ and $0 < y < 0.05$, respectively.

The present invention is the white light-emitting apparatus, wherein the non-sulfide phosphor particle is $(BaSr)_3SiO_5:Eu$.

The present invention is the white light-emitting apparatus, wherein the resin for covering the blue light element includes a cured product obtained by polymerizing a photopolymerizable resin.

The present invention is a white illumination apparatus, including a substrate; a plurality of blue light-emitting elements arranged on the substrate; a diffuser plate arranged on the blue light-emitting element and diffuses blue light emitted from the blue light-emitting element; and a phosphor sheet of which a phosphor layer for converting blue light into white light is provided, is arranged on the diffuser plate, and the phosphor sheet is irradiated with the blue light diffused by the diffuser plate, wherein the phosphor layer includes a sheet-shaped resin; a coated sulfide phosphor particle obtained by coating a sulfide phosphor particle with a silicon dioxide film, the silicon dioxide film of the coated sulfide phosphor particle containing powders of a sulfur-atom containing gas adsorbent made of a metal oxide, the sulfide phosphor particle including particles of a sulfide fluorescent substance and emitting green light when irradiated with blue light; and a coated non-sulfide phosphor particle obtained by coating a non-sulfide phosphor particle with a silicon dioxide film, the non-sulfide phosphor particle including particles of a non-sulfide fluorescent substance and emitting red light when irradiated with blue light, and wherein the sheet-shaped resin contains powders of the coated sulfide phosphor particle.

The present invention is the white illumination apparatus, wherein the silicon dioxide film of the coated non-sulfide phosphor particle contains the powders of the sulfur-atom containing gas adsorbent.

The present invention is the white illumination apparatus, further including: a transparent base material layer disposed on each of an opposed pair of side surfaces of the phosphor layer, each respective of the transparent base layers provided so as to be brought into contact with one respective of the side surfaces of the phosphor layer.

The present invention is the white illumination apparatus, wherein the phosphor layer has exposed side surfaces.

The present invention is the white illumination apparatus, wherein the phosphor layer has an outer periphery sealed by a frame so as to prevent the side surfaces of the phosphor layer from being exposed.

The present invention is the white illumination apparatus, wherein zinc oxide is used as the metal oxide.

The present invention is the white illumination apparatus, wherein the sulfide fluorescent substance is $(Sr_xM_{1-x-y})Ga_2S_4:Eu_y$, where M represents any one of Ca, Mg, and Ba, and x and y satisfy relationships of $0 \leq x \leq 1$ and $0 < y < 0.05$, respectively.

The present invention is the white illumination apparatus, wherein the non-sulfide fluorescent substance is $(BaSr)_3SiO_5:Eu$.

The present invention is the white illumination apparatus, wherein the sheet-shaped resin is formed by curing a sheet-shaped phosphor particle-containing resin composition including a polymerizable compound through a polymerization reaction of the polymerizable compound.

Effects of the Invention

According to one embodiment of the present invention, the chromaticity shift or corrosion due to deterioration of a sulfide phosphor particle can be suppressed by coating a phosphor particle with a silicon dioxide film, and coating at least a sulfide phosphor particle of the phosphor particle with a silicon dioxide film containing metal oxide powders.

DETAILED DESCRIPTION OF THE INVENTIONS

Embodiments of the present invention are hereinafter described in detail with reference to the drawings in the following order.
1. Coated phosphor particle
2. Phosphor particle-containing resin composition
3. Phosphor sheet and production method therefor
4. Examples of application to white light source and illumination apparatus
5. Examples 1. Coated Phosphor Particle A coated phosphor particle according to one embodiment of the present invention includes a phosphor particle coated with a silicon dioxide film. This can prevent ingress of water into the phosphor particle and can prevent deterioration of the phosphor particle due to water. In addition, at least a sulfide phosphor particle among the phosphor particle is coated with a silicon dioxide film including metal oxide powders. This can prevent release of a sulfur-based gas (sulfur-atom containing gas which includes sulfur-atom in its chemical structure) containing hydrogen sulfide or sulfur dioxide as a major component due to deterioration of the sulfide phosphor particle. Therefore, when the coated phosphor particle according to this embodiment is used, it is possible to suppress chromaticity shift of a phosphor layer formed of a phosphor particle-containing resin composition or corrosion of an electrode or the like of an LED element.

Figure 1:
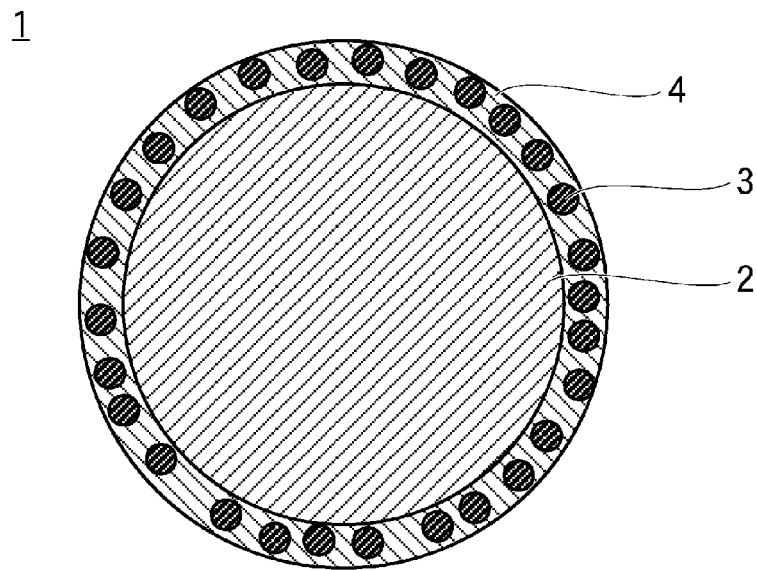
FIG. 1 is a cross-sectional view showing an example of a coated phosphor particle according to one embodiment of the present invention.

FIG. 1 is a cross-sectional view showing a coated phosphor particle obtained by coating a sulfide phosphor particle with a silicon dioxide film containing metal oxide powders. In the coated phosphor particle 1, a sulfide phosphor particle 2 is coated with a silicon dioxide film 4 including metal oxide powders 3. When the sulfide phosphor particle 2 is coated with the silicon dioxide film 4 including the metal oxide powders 3, the sulfur-based gas released from the sulfide phosphor particle 2 by hydrolysis of the sulfide phosphor particle 2 is adsorbed to the metal oxide powders 3 as a sulfur-atom containing gas adsorbent. Thus, for example, release of the sulfur-based gas from the sulfide phosphor particle 2 under high-temperature and high-humidity conditions can be suppressed. Therefore, for example, corrosion of an electrode or the like in an electronic material system, which causes deterioration of conductivity or the like, can be prevented.

The sulfide phosphor particle 2 is not particularly limited. For example, $SrGa_2S_4:Eu$ or $CaS:Eu$ is used. For example, a sulfide phosphor particle having a median diameter (d50) of from about 5 to 15 μm may be used as the sulfide phosphor particle 2.

The metal oxide powders 3 are preferably ones each having an excellent ability to adsorb a sulfur-based gas, e.g., hydrogen sulfide and capable of exhibiting an effect of suppressing the sulfur-based gas. Examples of the metal oxide powders 3 include zinc oxide powders and aluminum oxide ($Al_2O_3$) powders. In particular, zinc oxide powders are preferably used from the viewpoint that the effect of suppressing the sulfur-based gas can be more effectively exhibited. In addition, the metal oxide powders 3 may be subjected to surface treatment before use.

The metal oxide powders 3 each preferably have a particle diameter of 0.2 μm or less. When the particle diameter of each of the metal oxide powders 3 is set to 0.2 μm or less, it is possible to prevent deterioration of the ability of the metal oxide powders 3 to adsorb the sulfur-based gas released from the sulfide phosphor particle 2 by hydrolysis of the sulfide phosphor particle 2. This can effectively suppress release of the sulfur-based gas from the sulfide phosphor particle 2.

The amount of the metal oxide powders 3 is preferably 1 part by mass or more and less than 20 parts by mass, more preferably 5 parts by mass or more and 10 parts by mass or less, with respect to 100 parts by mass of the sulfide phosphor particle 2. When the amount of the metal oxide powders 3 is set to 1 part by mass or more with respect to 100 parts by mass of the sulfide phosphor particle 2, it is possible to provide an effective action of adsorbing the metal oxide powders 3, that is, to prevent deterioration of the ability of the metal oxide powders 3 to adsorb the sulfur-based gas. In addition, when the amount of the metal oxide powders 3 is set to less than 20 parts by mass with respect to 100 parts by mass of the sulfide phosphor particle 2, it is possible to prevent deterioration of properties, such as, a peak intensity and a luminance of the sulfide phosphor particle 2.

The silicon dioxide film 4 is formed on the surface of the sulfide phosphor particle 2 and coats the surface of the sulfide phosphor particle 2. Coating of the sulfide phosphor particle 2 with the silicon dioxide film 4 can prevent the sulfide phosphor particle 2 from being brought into contact with water so as to prevent deterioration of the sulfide phosphor particle 2 due to hydrolysis. This can prevent deterioration of properties such as an emission intensity and a luminance of the sulfide phosphor particle 2, and can maintain the properties of the sulfide phosphor particle 2. The silicon dioxide film 4 is formed by, for example, hydrolysis (sol-gel method) of an alkoxysilane.

The silicon dioxide film 4 preferably has a thickness enough to cover the metal oxide powders 3 by the silicon dioxide film 4. For example, when the metal oxide powders 3 each having a particle diameter of 0.2 μm or less are used, the thickness of the silicon dioxide film 4 is preferably set to in the range of at least 50 nm to at most 150 nm. When the thickness of the silicon dioxide film 4 is set to 50 nm or more, it is possible to more effectively prevent deterioration of the sulfide phosphor particle 2 due to hydrolysis. In addition, when the thickness of the silicon dioxide film 4 is set to 150 nm or less, it is possible to prevent deterioration of properties, such as, a peak intensity and a luminance of the sulfide phosphor particle 2.

As discussed above, when the sulfide phosphor particle 2 is coated with the silicon dioxide film 4 containing the metal oxide powders 3, the sulfur-based gas released from the sulfide phosphor particle 2 by hydrolysis of the sulfide phosphor particle 2 is adsorbed to the metal oxide powders 3. Thus, for example, release of the sulfur-based gas from the sulfide phosphor particle 2 under high-temperature and high-humidity conditions can be suppressed. Furthermore, deterioration of the sulfide phosphor particle 2 due to hydrolysis can be prevented because the sulfide phosphor particle 2 does not come into contact with water. This can prevent deterioration of properties of the sulfide phosphor particle 2.

Figure 2:
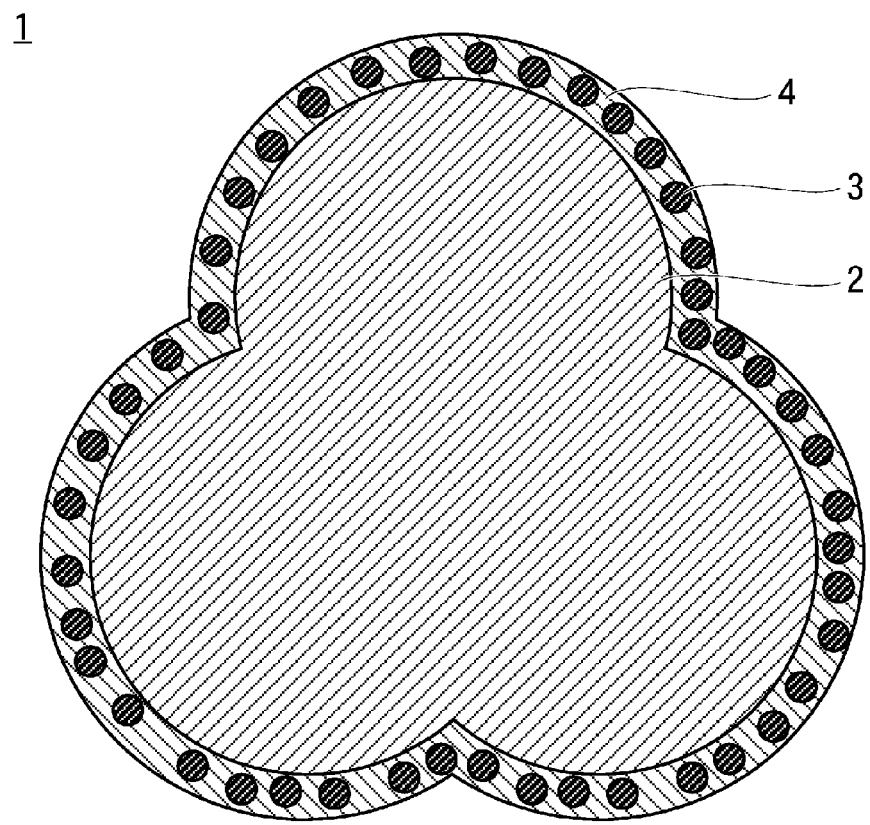
FIG. 2 is a cross-sectional view showing an example of a coated phosphor particle according to one embodiment of the present invention.

Furthermore, when a unit particle of the coated phosphor particle 1 as shown in FIG. 1 is defined as a primary particle, the coated phosphor particle 1 may have a form of a secondary particle formed by linking two or more primary particles as shown in FIG. 2. In addition, as shown in FIGS. 3 to 5, in the coated phosphor particle 1, the sulfide phosphor particle 2 may be coated with two or more layers of the silicon dioxide films 4, and at least one of the silicon dioxide films 4 may include the metal oxide powders 3.

Figure 3:
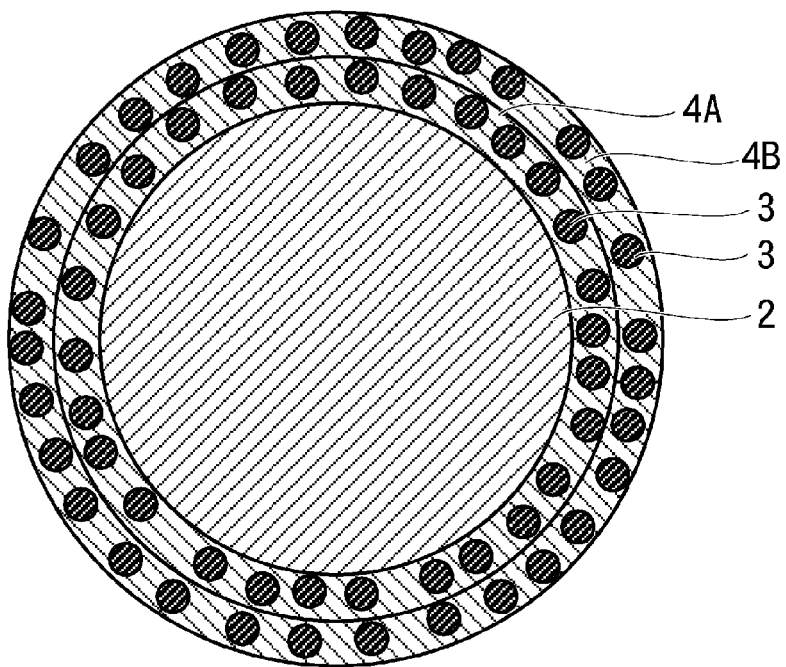
FIG. 3 is a cross-sectional view showing an example of a coated phosphor particle according to one embodiment of the present invention.

As shown in FIG. 3, in the coated phosphor particle 1, the sulfide phosphor particle 2 may be coated with two layers of the silicon dioxide films 4, that is, a silicon dioxide film 4A including the metal oxide powders 3 and a silicon dioxide film 4B including the metal oxide powders 3 in this order. In addition, as shown in FIG. 4, in the coated phosphor particle 1, the sulfide phosphor particle 2 may be coated with the silicon dioxide film 4A including the metal oxide powders 3 and a silica film, that is, the silicon dioxide film 4B without including the metal oxide powders 3 in this order. Furthermore, as shown in FIG. 5, in the coated phosphor particle 1, the sulfide phosphor particle 2 may be coated with the silicon dioxide film 4A without including the metal oxide powders 3 and the silicon dioxide film 4B including the metal oxide powders 3 in this order.

Figure 4:
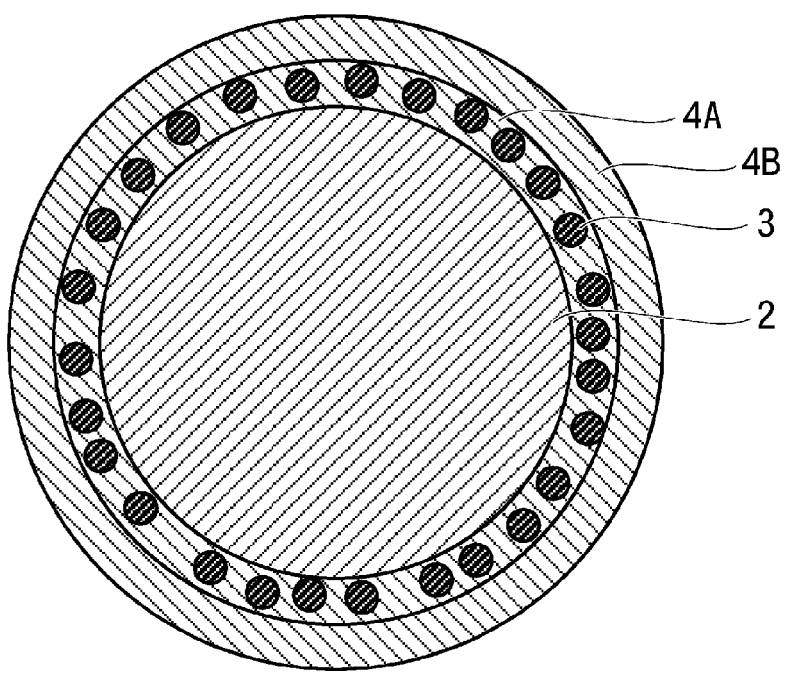
FIG. 4 is a cross-sectional view showing an example of a coated phosphor particle according to one embodiment of the present invention.
Figure 5:
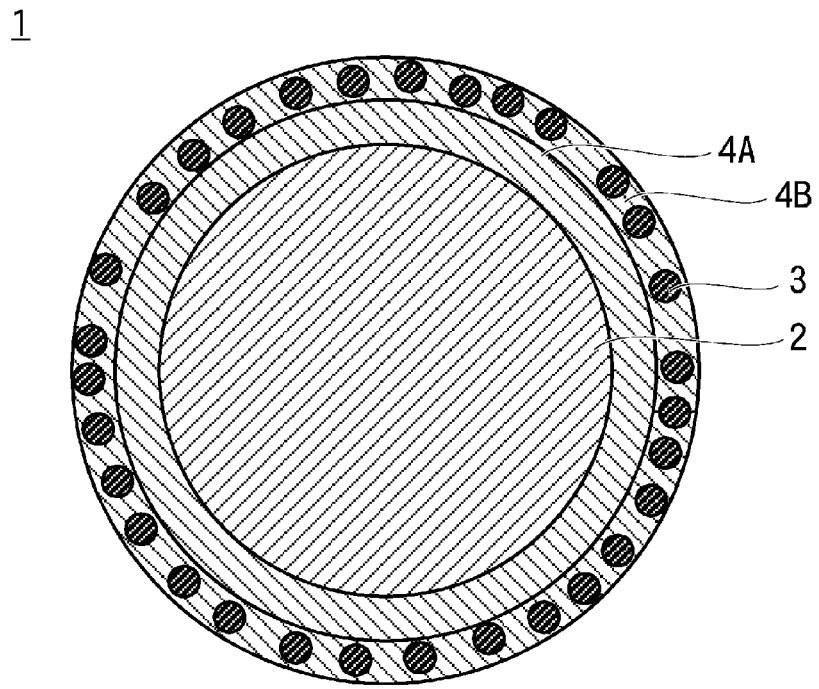
FIG. 5 is a cross-sectional view showing an example of a coated phosphor particle according to one embodiment of the present invention.

Among the coated phosphor particles 1 shown in FIGS. 3 to 5 above, the coated phosphor particles 1 shown in FIGS. 3 and 5, each including the metal oxide powders 3 in at least the silicon dioxide film 4B, are preferred from the viewpoint of more effectively suppressing release of the sulfur-based gas from the sulfide phosphor particle 2 under high-temperature and high-humidity conditions, for example. That is, the coated phosphor particles 1 including the metal oxide powders 3 in the silicon dioxide film 4B formed on the outermost surface side are preferred.

A production method for the coated phosphor particle includes: a mixing step of mixing phosphor particles, an alkoxysilane, and a catalyst in a solvent, followed by coating the phosphor particle with a silicon dioxide film limited of the mixture; and a separation step of separating the mixture into a solid phase and a liquid phase. When the sulfide phosphor particle is coated, in the mixing step, the phosphor particle is coated with a silicon dioxide film formed of a mixture obtained by mixing a sulfide phosphor particle, an alkoxysilane, metal oxide powders, and a catalyst in a solvent.

The alkoxysilane may be selected from, for example, an ethoxide, methoxide, and isopropoxide or the like. Examples thereof include tetraethoxysilane and tetramethoxysilane. Furthermore, the alkoxysilane may be alkoxysilane oligomer, such as, polyethyl silicate or a hydrolyzed condensate. Further, a silane coupling agent having an alkyl group, an amino group, a mercapto group, or the like that is not involved in a sol-gel reaction, such as, an alkylalkoxysilane, may be used as the alkoxysilane.

The solvent is not particularly limited. For example, water or an organic solvent may be used. Alcohol, ether, ketone, polyhydric alcohol, or the like may be used as the organic solvent. Methanol, ethanol, propanol, pentanol, or the like may be used as the alcohol. Ethylene glycol, propylene glycol, diethylene glycol, and the like may be used as the polyhydric alcohol. In addition, two or more kinds thereof may be used in combination as the solvent.

The catalyst is used for initiation of hydrolysis or polycondensation reaction of the alkoxysilane, and for example, an acidic catalyst or a basic catalyst may be used. Examples of the acidic catalyst include hydrochloric acid, sulfuric acid, boric acid, nitric acid, perchloric acid, tetrafluoroboric acid, hexafluoroarsenic acid, hydrobromic acid, acetic acid, oxalic acid, and methanesulfonic acid. Examples of the basic catalyst include hydroxide of alkali metal, such as, sodium hydroxide and ammonium. Of the catalysts, the basic catalyst is preferably used from the viewpoint of effectively preventing deterioration of the sulfide phosphor particle 2. It should be noted that two or more kinds of the acidic catalysts and basic catalysts may be used in combination as the catalyst.

When the sulfide phosphor particle is coated in the mixing step, the amount of the metal oxide powders blended is preferably 1 part by mass or more and 20 parts by mass or less with respect to 100 parts by mass of the sulfide phosphor particle. When 1 part by mass or more of the metal oxide powders are blended in 100 parts by mass of the sulfide phosphor particle, an effective action of adsorbing function of the metal oxide powders can be provided. Furthermore, when 20 parts by mass or less of the metal oxide powders are blended in 100 parts by mass of the sulfide phosphor particle, it is possible to prevent deterioration of properties, such as, a peak intensity and a luminance of the sulfide phosphor particle.

In the separation step, a mixture obtained by mixing the phosphor particle and the alkoxysilane in a solvent can be separated into a solid phase and a liquid phase so as to obtain the coated phosphor particle that is a solid phase from the mixture.

For example, in the separation step, the mixture is separated into a solid phase and a liquid phase using a suction filter, the separated solid phase is dried, and a sample obtained by the drying is crushed and subjected to sintering treatment. This process can provide a coated phosphor particle obtained by coating a phosphor particle with a silicon dioxide film. The temperature for drying the solid phase separated may be changed depending on the solvent to be used and is preferably from 80 to 110 degrees Celsius. In addition, the time for drying the solid phase separated is preferably 2 hours or more.

The temperature for sintering the sample is preferably from 150 to 250 degrees Celsius. In addition, the time for sintering the sample crushed is preferably 8 hours or more. It should be noted that the description above has been made on a method including performing coating treatment for a sulfide phosphor particle with a silicon dioxide film only once, that is, a method including coating a sulfide phosphor particle with only one layer of a silicon dioxide film, in production of a coated phosphor particle, but the method is not limited to the example. For example, the coating treatment with the silicon dioxide film may be repeated to coat the phosphor particle with two or more layers of the silicon dioxide film as shown in FIGS. 3 to 5.

2. Phosphor Particle-Containing Resin Composition

A phosphor particle-containing resin composition according to one embodiment of the present invention includes a coated phosphor particle obtained by coating a sulfide phosphor particle with a silicon dioxide film, a polymerizable compound, and a polymerization initiator.

In the coated phosphor particle, there are a sulfide phosphor particle, which is a sulfide phosphor particle coated by a silicon dioxide film including metal oxide powders as a sulfur-atom containing gas adsorbent, and a coated non-sulfide phosphor particle which is a non-sulfide phosphor particle coated by a silicon dioxide film. Metal oxide powders may or may not be included in the silicon dioxide film which coats the non-sulfide phosphor particle.

In order to emit white light using a blue LED, it is preferred to use mixed and coated phosphor particles including a coated phosphor particle of which red phosphor particle having a red fluorescence peak at a wavelength of from 590 nm to 620 nm when irradiated with blue excitation light is coated with silicon dioxide film and a coated phosphor particle of which a green phosphor particle having a green fluorescence peak at a wavelength of from 530 nm to 550 nm when irradiated with blue excitation light is coated with silicon dioxide film.

Examples of the red phosphor material include CaS:Eu and $(BaSr)_3SiO_5$:Eu, and an example of the green phosphor material is an inorganic phosphor material represented by the following general formula (1).

$$(Sr_xM_{1-x-y})Ga_2S_4:Eu_y \quad (1)$$

In the formula (1), M represents any one of Ca, Mg, and Ba, and x and y satisfy relationships of $0 \leq x \leq 1$ and $0 < y < 0.05$, respectively. A specific example of the green phosphor particle is $SrGa_2S_4$:Eu.

A preferred combination in this embodiment is mixed phosphor particles including a coated non-sulfide particle of which a particle of $(BaSr)_3SiO_5$:Eu, which emits red fluorescence as a non-sulfide particle is coated with a silicon dioxide film, and a coated sulfide particle of which a particle of $SrGa_2S_4$:Eu, which emits green fluorescence as a sulfide phosphor particle is coated with a silicon dioxide film.

If the mixing ratio of the coated phosphor particles to the resin composition for film formation is too small, the thickness of the coating film is liable to increase, resulting in increasing the amount of the solvent to be used, and when the mixing ratio is too large, the thickness of the coating film is liable to decrease, resulting in increasing chromaticity unevenness. Therefore, the coated is mixed in an amount of preferably from 1 to 10 parts by mass of the coated phosphor particle, more preferably from 3 to 6 parts by mass with respect to 100 parts by mass of the resin composition for film formation.

The polymerizable compound preferably includes a photocurable acrylate. The photocurable acrylate has an ester group exhibiting water-capturing ability and hence can further capture water having entered into the phosphor sheet. Therefore, the photocurable acrylate can prevent degradation of the phosphor particle due to water. In addition, a phosphor sheet can be obtained by the photocurable acrylate that is small in chromaticity shift due to deterioration.

Examples of such photocurable acrylate may include urethane (meth)acrylate, polyester (meth)acrylate, and epoxy acrylate. Of those, urethane (meth)acrylate may be preferably used from the viewpoint of heat resistance.

A preferred example of the urethane (meth)acrylate is urethane (meth)acrylate obtained by subjecting a reaction product of a polyol (preferably polyether polyol, polyolefin polyol, polyester polyol, or polycarbonate polyol) and a diisocyanate compound (preferably isophorone diisocyanate) to esterification with a hydroxyalkyl (meth)acrylate (preferably 2-hydroxypropyl acrylate).

When the content of the urethane (meth)acrylate is too small, adhesion property is liable to deteriorate, and thus, the urethane (meth)acrylate is contained in an amount of preferably at least 10 parts by mass, more preferably at least 30 parts by mass in 100 parts by mass of the photocurable acrylate.

It is preferred that the polymerization initiator be a photopolymerization initiator. Examples of the photopolymerization initiator may include: radical polymerization initiators such as an alkylphenone-based photopolymerization initiator, an acylphosphine oxide-based photopolymerization initiator, a titanocene-based photopolymerization initiator, an oxime ester-based polymerization initiator, and an oxyphenyl acetate-based polymerization initiator; cationic polymerization initiators such as a diazonium-based polymerization initiator, an iodonium-based polymerization initiator, and a sulfonium-based polymerization initiator. The use amount of the polymerization initiator is preferably from 0.1 to 10 parts by mass, more preferably from 1 to 10 parts by mass with respect to 100 parts by mass of the polymerizable compound.

Furthermore, any other light transmitting compound such as a (meth)acrylic monomer or oligomer, a coloring pigment, and the like may be blended in the phosphor particle-containing resin composition as required as long as the effect of the present invention is not impaired.

3. Phosphor Sheet and Production Method Therefor

Next, a phosphor sheet using the phosphor particle-containing resin composition is described with reference to the drawings.

Figure 6:
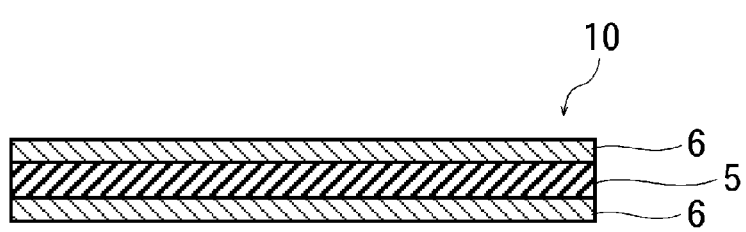
FIG. 6 is a cross-sectional view showing an example of a single-layer phosphor sheet.

FIG. 6 is a cross-sectional view showing a phosphor sheet according one embodiment of the present invention. In a phosphor sheet 10, one layer of a phosphor layer 5 that emits fluorescence when irradiated with excitation light is sandwiched by a pair of transparent base materials 6, and the phosphor layer 5 is formed of the phosphor particle-containing resin composition as above-discussed.

Figure 7:
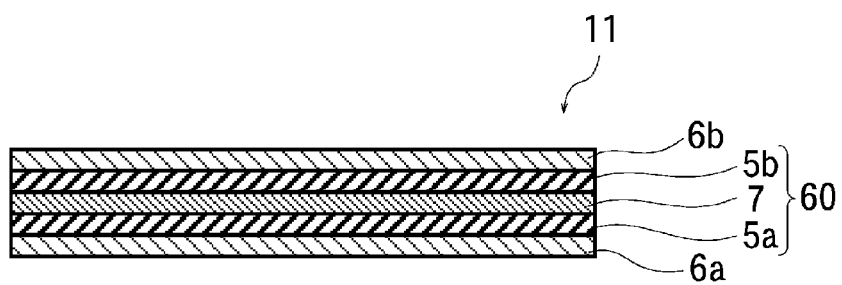
FIG. 7 is a cross-sectional view showing an example of a double-layer phosphor sheet.

Furthermore, FIG. 7 is a cross-sectional view showing a phosphor sheet including two phosphor layers. The phosphor sheet 10 is shown in FIG. 6 as an example of a phosphor sheet including one layer of the phosphor layer 5, but the phosphor sheet shown in FIG. 7 may include a laminated phosphor layer 60 having a double-layer structure obtained by laminating two phosphor layers 5a and 5b via a transparent separator 7. Similar to the case with the phosphor sheet 10 shown in FIG. 6, in a phosphor sheet 11, the laminated phosphor layer is sandwiched by a pair of transparent base materials 6a and 6b. When such double-layer structure is easily adopted, it is possible to arrange phosphor particles that are reactive with each other (for example, CaS:Eu and $SrCa_2S_4$:Eu) in different layers, and also, a phosphor particle and a resin component that are reactive with each other can be arranged in different layers. As a result, an unintended reaction thereof can be suppressed to extend the lifetime of the phosphor sheet. In this case, one of the phosphor layers 5a and 5b is preferably formed of a phosphor particle-containing resin composition including an oxide phosphor particle (preferably $(BaSr)_3SiO_5$:Eu) having a red fluorescence peak at a wavelength of from 590 to 620 nm which emits red light when irradiated with blue excitation light, and the other is preferably formed of a phosphor particle-containing resin composition containing a sulfide phosphor particle (preferably $SrGa_2S_4$:Eu) having a green fluorescence peak at a wavelength of from 530 to 550 nm when irradiated with blue excitation light and a zinc-containing porous silicate.

If the thicknesses of the phosphor layers 5, 5a, and 5b are too small, it is impossible to provide sufficient emission intensity because the absolute amount of the phosphor particles becomes smaller due to their thicknesses. On the other hand, if the thicknesses thereof are too large, target chromaticity cannot be achieved. Therefore, the thicknesses are preferably from 20 to 150 µm, more preferably from 60 to 120 µm.

As the transparent base materials 6a and 6b and the transparent separator 7, there may be used a thermoplastic resin film or a thermosetting or photocurable resin film that has a thickness of from 10 to 100 µm. Examples thereof may include a polyester film, a polyamide film, a polyimide film, a polysulfone film, a triacetylcellulose film, and a polyolefin film. The surfaces of the films may be subjected to corona discharge treatment, treatment with a silane coupling agent, or the like, as required, in order to improve adhesiveness to the phosphor particle-containing resin composition.

Figure 8:
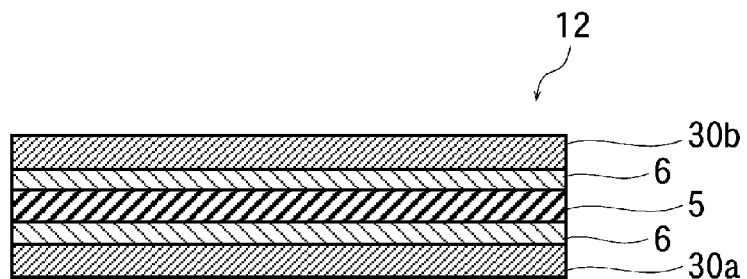
FIG. 8 is a cross-sectional view showing an example of a single-layer phosphor sheet laminated with sealing films.
Figure 9:
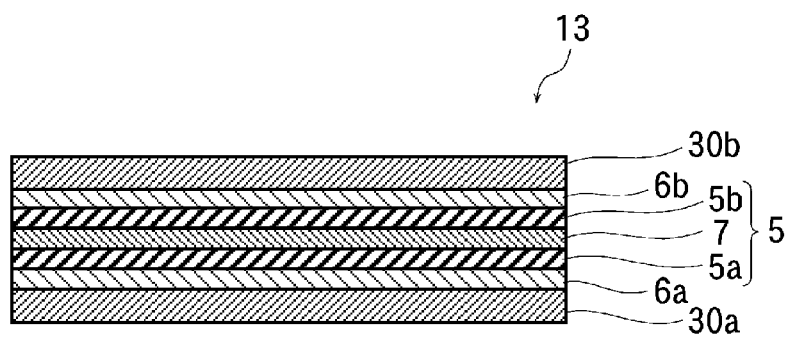
FIG. 9 is a cross-sectional view showing an example of a double-layer phosphor sheet laminated with sealing films.

In addition, as shown in FIGS. 8 and 9, the phosphor sheets 10 and 11 shown in FIGS. 6 and 7 are preferably sandwiched by two sealing films 30a and 30b from the both surface sides thereof. In this embodiment, the phosphor particle is coated with the silicon dioxide film, and at least the sulfide phosphor particle of the phosphor particle is coated with the silicon dioxide film containing the metal oxide powders. Therefore, as shown in FIGS. 8 and 9, even when the end portions of the phosphor layer are exposed, it is possible to prevent release of the sulfur-based gas and to reduce the chromaticity shift. That is, the phosphor sheet including a phosphor layer having exposed portions between a pair of transparent base materials may be used, and thus, the phosphor layer is not required to be subjected to sealing treatment, and the production cost of the phosphor sheet can be reduced. It goes without saying that the phosphor sheets 10 and 11 may be sealed with two sealing films 30a and 30b from both surface sides thereof, or may be sealed with two sealing films 30a and 30b and frames that surround outer peripheries of the phosphor sheets 10 and 11. Such sealing can further prevent ingress of water into the phosphor layers 5, 5a, and 5b because the side surfaces of the phosphor sheets 10 and 11 are not exposed.

Figure 10:
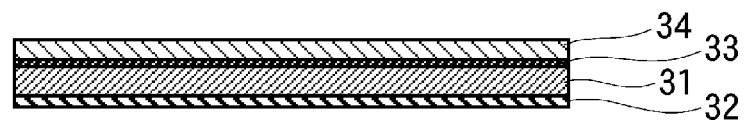
FIG. 10 is a cross-sectional view showing an example of a sealing film.

FIG. 10 is a cross-sectional view showing an example of the sealing films. As the sealing film, there may be used one obtained by forming an adhesion layer 32 on a base film 31. In addition, in order to improve water vapor barrier property of the sealing film, a silicon oxide layer 33 having a thickness of from 5 to 20 nm may be formed by a deposition method or the like on the reverse surface of the base film 31 on the adhesion layer 32 side or on the surface on the opposite side thereof. In the case of the latter, a surface protection film 34 may be laminated on the silicon dioxide layer 33 via an adhesion layer (not shown). As the base film 31 and the surface protection film 34, there may be used ones appropriately selected from the films listed above as examples of the transparent base material 6a and 6b and the transparent separator 7. As the adhesion layer for lamination of the base film 31 and the surface protection film 34, there may be used one appropriately selected from known adhesives, such as, urethane-based adhesives and acrylic-based adhesives. In addition, the thickness of the adhesion layer is usually from 10 to 50 µm.

Next, a production method for the phosphor sheet 10 is described with reference to the drawings. The single-layer phosphor sheet 10 shown in FIG. 6 can be produced by forming the phosphor particle-containing resin composition into a film on the transparent base material 6 by a conventional method to form the phosphor layer 5 and laminating another transparent base material 6 on the layer. Furthermore, the both surfaces of the phosphor sheet 10 are sandwiched by the sealing films 30a and 30b in a manner such that the adhesion layer 32 is located on the inside, and the whole can be subjected to thermocompression bonding to produce a phosphor sheet 12 having the structure shown in FIG. 8.

It should be noted that the photocurable compound contained in the phosphor layer 5 is required to undergo photo-curing (polymerization) by irradiation with an active energy ray such as an ultraviolet ray. In this case, the phosphor layer 5 may be directly irradiated with the active energy ray or may be irradiated with the active energy ray through the transparent base material 6 or the sealing film.

The double-layer phosphor sheet 11 shown in FIG. 7 can be produced by: forming the phosphor-containing resin composition into a film on the transparent base material 6a by a conventional method to form the phosphor layer 5a; laminating the transparent separator 7 on the layer; forming another phosphor-containing resin composition containing another phosphor different from the phosphor contained in the phosphor-containing resin composition into a film by a conventional method to form the phosphor layer 5b; and laminating the transparent base material 6b on the layer. Furthermore, the both surfaces of the phosphor sheet 11 are sandwiched in such a manner that the sealing films 30a and 30b so that the adhesion layer 32 is located on the inside, and the whole can be subjected to thermocompression bonding to produce a phosphor sheet 13 having the structure illustrated in FIG. 9.

It should be noted that the photocurable compound contained in the phosphor layers 5a and 5b is required to undergo photo-curing (polymerization) by irradiation with an active energy ray, such as, an ultraviolet ray. In this case, the phosphor layers 5a and 5b may be directly irradiated with the active energy ray or may be irradiated with the active energy ray through the transparent base materials 6a and 6b, the transparent separator 7 and/or the sealing films 30a and 30b.

4. Examples of application to White Light Source and Illumination Apparatus

The phosphor particle-containing resin composition including the coated sulfide phosphor particle and phosphor sheet as discussed above may be applied to, for example, a white light source and an illumination apparatus.

<4-1. White Light Source>

Figure 11:
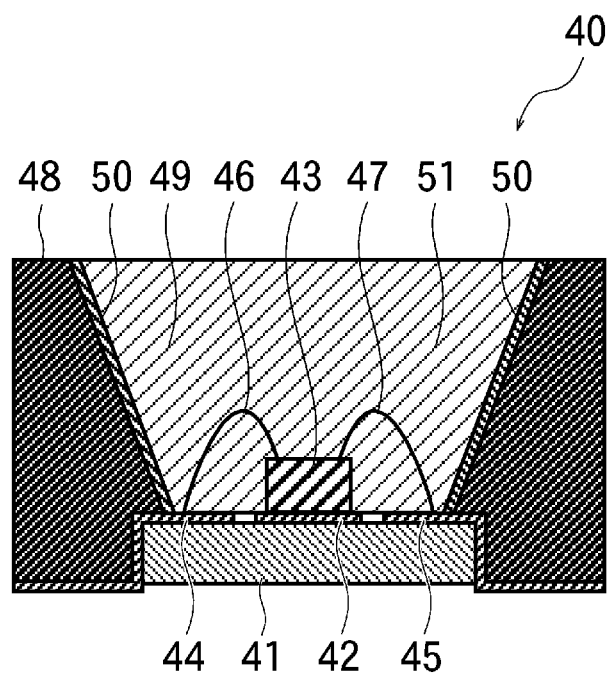
FIG. 11 is a cross-sectional view showing an example of a white light source according to one embodiment of the present invention.

FIG. 11 is a cross-sectional view showing an example of a white light source. As illustrated in FIG. 11, a white light source 40 has a blue light-emitting element 43 on a pad portion 42 formed on an element substrate 41. Electrodes 44 and 45 for supplying electricity to drive the blue light-emitting element 43 are formed on the element substrate 41 so as to maintain their insulation, and the electrodes 44 and 45 are respectively connected to the blue light-emitting element 43 by leads 46 and 47, for example.

Furthermore, for example, a resin layer 48 is formed on the periphery of the blue light-emitting element 43, and an opening 49 that opens the upper part of the blue light-emitting element 43 is formed in the resin layer 48. In the opening 49, a sloping surface having an opening area that expands in the light emission direction of the blue light-emitting element 43 is formed, and a reflective film 50 is formed on the sloping surface. That is, in the resin layer 48 having the cone-shaped opening 49, the opening 49 is covered with the reflective film 50, and the blue light-emitting element 43 is arranged on the bottom of the opening 49. Then, a kneaded product 51 obtained by kneading red phosphor particles and green phosphor particles in a transparent resin is cured in the opening 49 so as to cover the blue light-emitting element 43, to thereby form the white light source 40.

Here, when a phosphor particle-containing resin composition containing a zinc-containing porous silicate, a sulfide phosphor particle having a green fluorescence peak when irradiated with blue excitation light and coated with the silicon dioxide film containing zinc oxide, a red phosphor particle having a red fluorescence peak when irradiated with blue excitation light, a polymerizable compound, and a polymerization initiator is used as the kneaded product 51, it is possible to suppress corrosion of electrodes or the like of an LED element due to a sulfur-based gas generated by deterioration of the sulfide phosphor particle.

<4-2. Illumination Apparatus>

Figure 12:
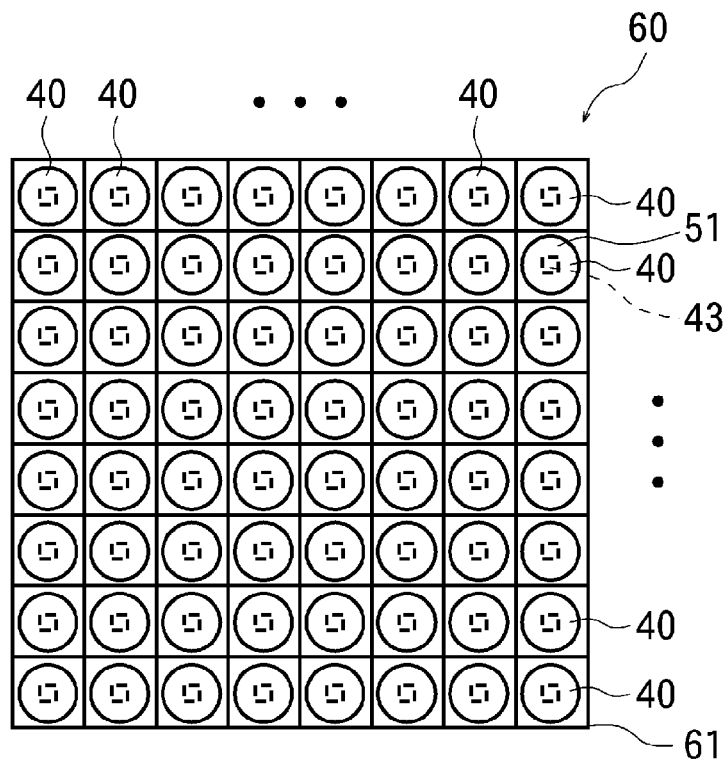
FIG. 12(A) and FIG. 12(B) are plan views showing examples of an illumination apparatus according to one embodiment of the present invention.
Figure 12:
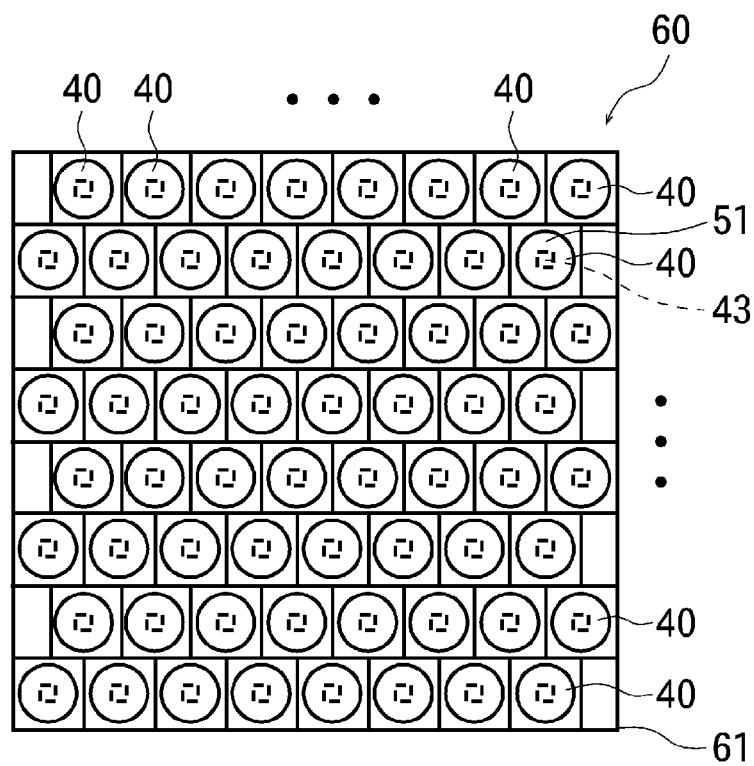

FIGS. 12(A) and (B) are front views each showing an example of an illumination apparatus. As shown in FIGS. 12(A) and (B), in an illumination apparatus 60, a plurality of the white light sources 40 discussed with reference to FIG. 11 are arranged on the illumination substrate 61. For example, the arrangement of the white light sources may be a tetragonal lattice arrangement as shown in FIG. 12(A) or an arrangement in which the white light sources are shifted by half pitch every other row as shown in FIG. 12(B), In addition, the pitch of the shift is not limited to half, and may be one-third pitch or one-fourth pitch. Further, the white light sources may be shifted every other row or every a plurality of rows (for example, two rows).

In addition, there may be employed an arrangement in which the white light sources are shifted by, for example, half pitch every other column (not shown). The pitch of the shift is not limited to half, and may be one-third pitch or one-fourth pitch. Further, the white light sources may be shifted every other column or every a plurality of columns (for example, two columns). That is, the shift manner of the white light sources 10 is not limited.

The white light source 40 has a structure similar to the one described with reference to FIG. 11. That is, the white light source 40 has, on the blue light-emitting element 43, the kneaded product 51 obtained by kneading red phosphor particles and green phosphor particles in a transparent resin. The phosphor particle-containing resin composition discussed above is used as the kneaded product 51.

In addition, in the illumination apparatus 60, a plurality of the white light sources 40 capable of performing light emission almost the same as point emission are arranged on the illumination substrate 61 in the longitudinal and lateral directions, and hence can perform light emission almost the same as surface emission. Therefore, the illumination apparatus 60 can be used as, for example, a backlight of a liquid crystal display apparatus. In addition, the illumination apparatus 60 can be used as an illumination apparatus to be applied to various purposes, such as, a typical illumination apparatus, an illumination apparatus for photographing, and an illumination apparatus for a construction field.

The illumination apparatus 60 uses the white light sources 40, so that it can obtain white light having a wide color gamut and brightness. For example, when the illumination apparatus 60 is used in a backlight of a liquid crystal display apparatus, it is possible to generate pure white light with a high luminance in a display and to improve quality of a display screen.

Figure 13:
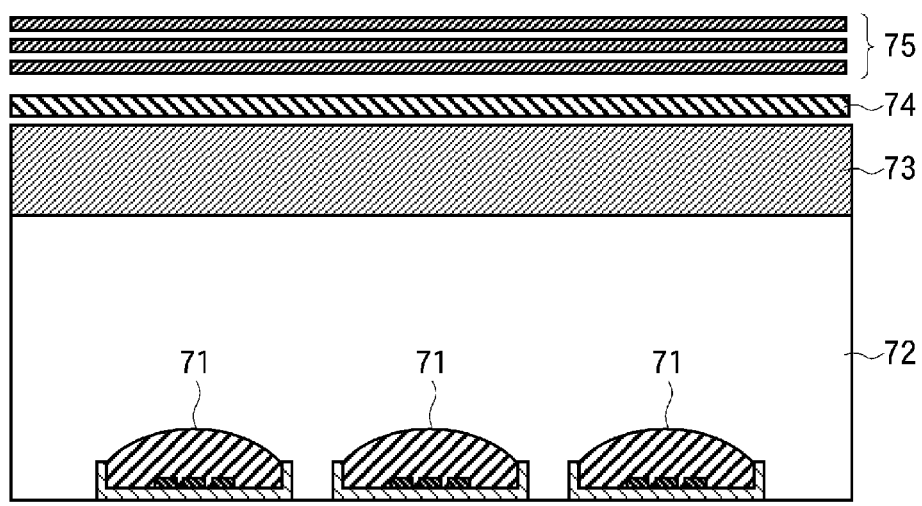
FIG. 13 is a cross-sectional view showing an example of an illumination apparatus according to one embodiment of the present invention.

In addition, as shown in FIG. 13, application to an illumination apparatus using a phosphor sheet 10 is possible.

A illumination apparatus 70 includes light-emitting structures 71 each having a blue light-emitting element covered by a transparent resin having a convex surface shape, a substrate 72 in which the light-emitting structures 71 are two-dimensionally arranged, a diffuser plate 73 that diffuses blue light of the blue light-emitting elements, a phosphor sheet 74 of which white light is obtained by the blue light of the blue light-emitting element according to FIGS. 6 to 10 that is arranged so as to be spaced apart from the substrate 72 and contains powder-shaped phosphor particles that emits white light from blue light of the blue light-emitting elements, and optical films 75.

The substrate 72 is arranged so as to be spaced apart from the sheet 74 by from about 10 to 50 mm, and the illumination apparatus 70 has a so-called remote phosphor structure. The gap between the substrate 72 and the phosphor sheet 74 is maintained by a plurality of support columns or reflector plates, and the support columns or reflector plates are provided so as to surround, in four directions of, the space formed by the substrate 72 and the phosphor sheet 74.

The light-emitting structures 71 form a so-called LED package including, for example, an InGaN-based blue light-emitting diode (LED) chips as the blue light-emitting elements.

The substrate 72 is fainted of a glass cloth base material using a resin, such as, a phenol, epoxy, polyimide, polyester, bismaleimide triazine, or allylated polyphenylene oxide resin. The light-emitting structures 71 are arranged, on the substrate 72 at two-dimensionally due to the whole surface of the phosphor sheet 74 at regular intervals in a predetermined pitch. As required, the surface of the substrate 72 on which the light-emitting structures 71 are mounted may be subjected to reflection treatment.

The diffuser plate 73 is used for diffusing light emitted from the light-emitting structures 71 in a wide range to a degree at which the shape of the light source becomes invisible. The diffuser plate 73 to be used has a total light transmittance of 20% or more and 80% or less.

The phosphor sheet 74 to be used may have a structure shown above in any of FIGS. 6 to 9. That is, the phosphor particle-containing resin composition containing a sulfide phosphor particle coated with the silicon dioxide film containing zinc oxide, a polymerizable compound, and a polymerization initiator is used to form the phosphor layer. This can suppress corrosion of electrodes or the like of an LED element due to a sulfur-based gas generated by deterioration of a sulfide phosphor particle.

The optical films 75 include, for example, a reflective polarizing film, a lens film, and a diffusion film for improving visibility of a liquid crystal display apparatus. Here, the lens film is an optical film in which small lenses are formed in an array on one surface and is used for improving directionality in the front direction of diffused light in order to increase the luminance.

As discussed above, when a resin composition includes a coated phosphor particle obtained by coating a phosphor particle with a silicon dioxide film, a polymerizable compound, and a polymerization initiator, the resin composition having the coated phosphor particle including at least a sulfide phosphor particle coated with a silicon dioxide film including metal oxide powders, is applied to the white light source 40, the illumination apparatus 60, and the illumination apparatus 70, it is possible to suppress release of the sulfur-based gas from the sulfide phosphor particle under high-temperature and high-humidity conditions, for example. This can prevent deterioration of conductivity or the like due to corrosion of electrodes or the like in the white light source 40, the illumination apparatus 60, and the illumination apparatus 70. Furthermore, this can suppress the chromaticity shift of the phosphor layer formed of the phosphor particle-containing resin composition.

EXAMPLES

5. Examples

Examples of the present invention are discussed below. In Examples, phosphor sheets each having a phosphor layer obtained by dispersing a coated sulfide phosphor particle in a UV-curable acrylic resin were prepared, and the luminance and CIE chromaticity of each phosphor sheet were measured to evaluate its chromaticity shift. Furthermore, presence or absence of generation of a sulfur-based gas in each phosphor sheet is evaluated. It should be noted that the present invention is not limited to Examples.

Measurement of the luminance and CIE chromaticity of each phosphor sheet, evaluation of the chromaticity shift of each phosphor sheet, and presence or absence of generation of the sulfur-based gas of each phosphor sheet are carried out as discussed below.

[Measurement of Luminance and CIE Chromaticity]

The luminance and CIE chromaticity of each phosphor sheet are measured using a spectroradiometer (SR-3, manufactured by TOPCON TECHNO HOUSE CORPORATION).

[Evaluation of Chromaticity Shift]

Each phosphor sheet is left to stand in an environment of 60 degrees Celsius and 90% RH for 1,000 hours, and a difference ($\Delta u'v'$) in whiteness before and after the standing (JIS Z8518) is determined. Then, the $\Delta u'v'$ value of a phosphor sheet of which metal oxide as gas adsorbent dispersed in the silicon dioxide film coating the phosphor particle is not defined as 1, and a relative value is calculated based on the value.

[Presence or Absence of Generation of Sulfur-Based Gas]

A silver piece test is carried out to determine an indicator of release of the sulfur-based gas. A silver piece having a diameter of 15 mm and a thickness of 2 mm (silver bullion (purity: 99.95% or more) specified by JIS H 2141 "silver bullion") is polished with a metal polish (PIKAL, manufactured by NIHON MARYYO KOGYO CO., LTD.) and is subjected to ultrasonic cleaning in acetone. After the ultrasonic cleaning, the silver piece is adhered to the back of a lid of an airtight bottle (100-ml glass weighing bottle) with a double-faced tape, and a phosphor sheet shown in the Table 1 (2 cm×4 cm) is placed on the bottom in the airtight bottle. Water is added to a glass cell, and the cell is placed in the airtight bottle to achieve a humidity of 100% RH. Furthermore, the lid of the airtight bottle is closed and sealed with a parafilm and a polyimide tape, and the bottle is placed in an oven at 85 degrees Celsius for 168 hours. After the standing for 168 hours, presence or absence of generation of a sulfur-based gas was judged based on the degree of a change in color of the silver piece. The silver piece having turned black was evaluated as Symbol "×", the silver piece having turned brown was evaluated as Symbol "Δ", and the silver piece not having colored was evaluated as Symbol "○".

Example 1

10 g of phosphor particles for red (($Ba,Sr)_3SiO_6$:Eu), 80 g of ethanol, 5 g of pure water, and 6 g of 28% aqueous ammonia are added into a resin container (PE), a magnetic stirrer was loaded thereinto, and the mixture is stirred for 10 minutes in a thermostatic chamber at 40 degrees Celsius. After that, 5 g of tetraethoxysilane and 35 g of ethanol were added thereto. The time when the addition is completed is defined as 0 minutes, and the mixture is stirred for 3 hours. After completion of stirring, the mixture is subjected to suction filtration using a vacuum pump, and the sample collected is transferred to a beaker. The sample is washed with water and ethanol, and filtered again to collect a sample. The sample collected was dried at 85 degrees Celsius for 2 hours and sintered at 200 degrees Celsius for 8 hours to obtain a coated non-sulfide phosphor particles obtained by coating a non-silfide phosphor particle with a silicon dioxide film.

Furthermore, 10 g of sulfide phosphor particles for green (SrGa$_2$S$_4$:Eu), 80 g of ethanol, 5 g of pure water, 6 g of 28% aqueous ammonia, and 0.1 g (1 part by mass with respect to 100 parts by mass of a sulfide phosphor particles) of zinc oxide powders each having a particle diameter of from 0.1 to 0.2 μm (K-FRESH MZO, manufactured by Tayca Corporation) are added into a resin container (PE), a magnetic stirrer was loaded thereinto, and the mixture is stirred for 10 minutes in a thermostatic chamber at 40 degrees Celsius. After that, 5 g of tetraethoxysilane and 35 g of ethanol are added thereto. The time when the addition is completed was defined as 0 minutes, and the mixture is stirred for 3 hours. After completion of stirring, the mixture is subjected to suction filtration using a vacuum pump, and the sample collected is transferred to a beaker. The sample is washed with water and ethanol, and filtered again to collect a sample. The sample collected is dried at 85 degree Celsius for 2 hours and sintered at 200 degrees Celsius for 8 hours to afford coated sulfide phosphor particles obtained by coating a sulfide phosphor particle with a silicon dioxide film containing zinc oxide powders.

9.0 wt % of the coated red phosphor particles and 4.5 wt % of the coated green phosphor particles are uniformly dispersed in a resin composition for film formation containing a photocurable urethane methacrylate (ARONIX 1600M, manufactured by TOAGOSEI CO., LTD.) and a photopolymerization initiator (DAROCUR 1173, manufactured by NAGASE & CO., LTD.) to obtain a phosphor particle-containing resin composition.

The phosphor particle-containing resin composition is applied onto a first polyethylene terephthalate film so as to have a height of 75 μm after drying and is irradiated with an ultraviolet ray (7,000 mJ/cm2) to polymerize the urethane acrylate, and a second polyethylene terephthalate film was laminated on the phosphor layer, followed by thermocompression bonding treatment (100 degrees Celsius, 0.2 Pa). Furthermore, barrier films each having a water vapor transmission rate of 0.3 g/m2/24 h are provided on both surfaces thereof, and thermocompression bonding treatment (100 degrees Celsius, 0.2 Pa) is carried out to obtain a phosphor sheet 12 as shown in FIG. 8, of which the phosphor layer has exposed end portions. The phosphor sheet 12 is found to have a relative chromaticity shift value of 0.84 and is evaluated as Symbol "○" by evaluation on generation of the sulfur-based gas.

Comparative Example 1

Figure 14:
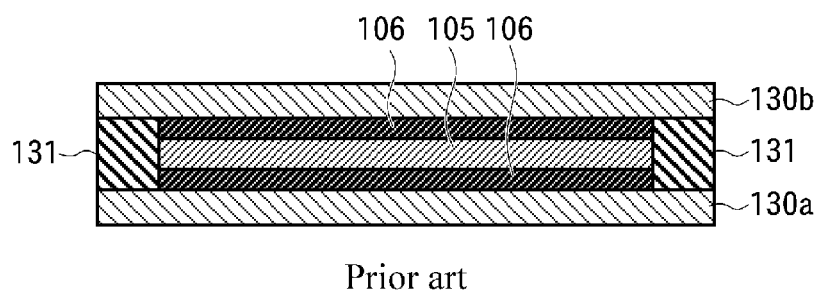
FIG. 14 is a cross-sectional view showing an example of a single-layer phosphor sheet sealed with sealing films.

A phosphor sheet is produced in the same manner as in Example 1 except that sulfide phosphor particles for green is not subjected to coating treatment before use, and sealing is performed by providing frames 131 at the end portions of the phosphor layer 105 as illustrated in FIG. 14. The phosphor sheet is found to have a relative chromaticity shift value of 1.00 and was evaluated as Symbol "○" by evaluation on generation of the sulfur-based gas.

Comparative Example 2

A phosphor sheet is produced in the same manner as in Example 1 except that sulfide phosphor particles for green are used without coating treatment. A relative value of the chromaticity shift of the phosphor sheet was 1.00, and generation of the sulfur-based gas was evaluated to be "×".

Comparative Example 3

A phosphor sheet is produced in the same manner as in Example 1 except that no zinc oxide powders are added in the coating treatment of the sulfide phosphor particles for green. A relative value of the chromaticity shift of the phosphor sheet was 1.20, and generation of the sulfur-based gas was evaluated as Symbol "Δ".

Table 1 shows results of the measurement and evaluation in Example 1 and Comparative Examples 1 to 3.

TABLE 1

Measurement result

| | | Example 1 | Comparative Example 1 | Comparative Example 2 | Comparative Example 3 |
|---|---|---|---|---|---|
| Red phophor particle | Addition amount (wt %) | 9.0 | 9.0 | 9.0 | 9.0 |
| | Silica coating | Yes | Yes | Yes | Yes |
| | Metal oxide powder | No | No | No | No |
| Green phophor particle | Addition amount (wt %) | 4.5 | 4.5 | 4.5 | 4.5 |
| | Silica coating | Yes | No | No | Yes |
| | Metal oxide powder | Yes | No | No | No |
| Exposed portion of end of phosphor layer | | Yes | No | Yes | Yes |
| Chromaticity shift | (Relative value) | 0.84 | 1 | 1 | 1.2 |
| Sulfur gas generation | (Silver piece test evaluation) | ○ | ○ | X | Δ |

Metal oxide powder is ZnO.

A comparison between the results of Comparative Example 1 and Comparative Example 2 reveals that sealing of the end portions of the phosphor layer can suppress release of the sulfur-based gas. Furthermore, a comparison between the results of Comparative Example 2 and Comparative Example 3 reveals that coating of the sulfide phosphor particle with the silicon dioxide film can suppress release of the sulfur-based gas. Moreover, a comparison between the results of Example 1 and Comparative Example 3 reveals that coating of the sulfide phosphor particle with the silicon dioxide film including the zinc oxide powders can sufficiently suppress release of the sulfur-based gas and can decrease the chromaticity shift.

That is, as shown in Example 1, when the phosphor particle is coated with the silicon dioxide film, and when at least the sulfide phosphor particle of the phosphor particle is coated with the silicon dioxide film including the metal oxide powders, it is possible to prevent release of the sulfur-based gas and to reduce the chromaticity shift even in the phosphor sheet including the phosphor layer having exposed end portions. Therefore, the phosphor sheet is not required to undergo sealing treatment of the phosphor layer and can reduce the cost of production of the phosphor sheet.

REFERENCE SIGNS LIST 1 coated phosphor particle; 2 sulfide phosphor particle; 3 metal oxide powder; 4 silicon dioxide film; 5, 5a, 5b phosphor layer; 6, 6a, 6b transparent base material; 7 transparent separator; 10, 11, 12, 13 phosphor sheet; 20 laminated phosphor layer; 30a, 30b sealing film; 31 base film; 32 adhesion layer; 33 silicon oxide layer; 34 surface protection film; 40 white light source; 41 element substrate; 42 pad portion; 43 blue light-emitting element; 44 electrode; 45 electrode; 46 lead; 47 lead; 48 resin layer; 49 opening; 50 reflective film; 51 kneaded product; 60 illumination apparatus; 61 illumination substrate; 70 illumination apparatus; 71 light-emitting structure; 72 substrate; 73 diffuser plate; 74 phosphor sheet; 75 optical film.

What is claimed is:

1. A phosphor sheet, comprising:
    a phosphor layer;
    wherein the phosphor layer includes
        a sheet-shaped resin, and
        a coated sulfide phosphor particle obtained by coating a sulfide phosphor particle made particles of a sulfide fluorescent substance with a silicon dioxide film, the silicon dioxide film containing powders of a sulfur-atom containing gas adsorbent made of a metal oxide;
        wherein the sheet-shaped resin contains powders of the coated sulfide phosphor particle, and
        the coated sulfide phosphor particle emits light when irradiated with excitation light.

2. The phosphor sheet according to claim 1,
    wherein the sheet-shaped resin includes a coated non-sulfide phosphor particle obtained by coating a non-sulfide phosphor particle including particles of a non-sulfide fluorescent substance, which is free of sulfur, with a silicon dioxide film.

3. The phosphor sheet according to claim 2,
    wherein the silicon dioxide film of the coated non-sulfide phosphor particle contains the powders of the sulfur-atom containing gas adsorbent.

4. The phosphor sheet according to claim 1, further comprising:
    a transparent base material layer disposed on each of an opposed pair of side surfaces of the phosphor layer, where each of the respective transparent base layers is provided so as to be brought into contact with one of the side surfaces of the phosphor layer.

5. The phosphor sheet according to claim 4,
    wherein the phosphor layer has an exposed side surface.

6. The phosphor sheet according to claim 4,
    wherein the phosphor layer has an outer periphery sealed by a frame so as to prevent the side surfaces of the phosphor layer from being exposed.

7. The phosphor sheet according to claim 1,
    wherein the metal oxide is zinc oxide.

8. The phosphor sheet according to claim 2,
    wherein the coated sulfide phosphor particle emits green light when irradiated with blue light, and
    wherein the non-sulfide fluorescent substance emits red light when irradiated with blue light.

9. The phosphor sheet according to claim 1,
    wherein the sulfide fluorescent substance is $(Sr_xM_{1-x-y})Ga_2S_4:Eu_y$, where M represents any one of Ca, Mg, and Ba, and x and y satisfy relationships of $0 \leq x \leq 1$ and $0 < y < 0.05$, respectively.

10. The phosphor sheet according to claim 2,
    wherein the non-sulfide fluorescent substance is $(BaSr)_3SiO_5:Eu$.

11. The phosphor sheet according to claim 1,
    wherein the sheet-shaped resin is formed by curing a sheet-shaped phosphor particle-containing resin composition containing a polymerizable compound through a polymerization reaction of the polymerizable compound.

12. The phosphor sheet according to claim 11,
    wherein the polymerizable compound includes a photocurable acrylate, and
    wherein the phosphor particle-containing resin composition contains a photopolymerization initiator.

13. A phosphor particle-containing resin composition, comprising:
    a polymerizable compound; and
    a coated sulfide phosphor particle obtained by coating a sulfide phosphor particle made of particles of a sulfide fluorescent substance with a silicon dioxide film containing powders of a sulfur-atom containing gas adsorbent made of a metal oxide;
    wherein the polymerizable compound includes powders of the coated sulfide phosphor particle.

14. The phosphor particle-containing resin composition according to claim 13, wherein the polymerizable compound contains a coated non-sulfide phosphor particle obtained by coating particles of a non-sulfide fluorescent substance, which is free of sulfur, with a silicon dioxide film.

15. The phosphor particle-containing resin composition according to claim 14,
    wherein the silicon dioxide film of the coated non-sulfide phosphor particle contains the powders of the sulfur-atom containing gas adsorbent.

16. The phosphor particle-containing resin composition according to claim 13,
    wherein the metal oxide is zinc oxide.

17. The phosphor particle-containing resin composition according to claim 13,
    wherein the sulfide phosphor particle is $(Sr_xM_{1-x-y})Ga_2S_4:Eu_y$, where M represents any one of Ca, Mg, and Ba, and x and y satisfy relationships of $0 \leq x \leq 1$ and $0 < y < 0.05$, respectively.

18. The phosphor particle-containing resin composition according to claim 17,
    wherein the non-sulfide phosphor particle is $(BaSr)_3SiO_5:Eu$.

19. The phosphor particle-containing resin composition according to claim 13,
wherein the polymerizable compound contains a photocurable acrylate, and
wherein the polymerizable compound contains a photopolymerization initiator.

20. A white light-emitting apparatus, comprising:
a blue light-emitting element covered with a resin,
the resin for covering the light-emitting element includes powders of a coated sulfide phosphor particle obtained by coating a sulfide phosphor particle with a silicon dioxide film containing powders of a sulfur-atom containing gas adsorbent made of a metal oxide,
wherein the sulfide phosphor particle are particles of a sulfide fluorescent substance and emit green light when irradiated with blue light,
wherein powders of coated non-sulfide phosphor particle is obtained by coating a non-sulfide phosphor particle with a silicon dioxide film, the non-sulfide phosphor particle comprising particles of a non-sulfide fluorescent substance free of sulfur, and emit red light when irradiated with blue light, and
wherein the white light emitting apparatus emits white light by light emission of the blue-light-emitting element.

21. The white light-emitting apparatus according to claim 20,
wherein the metal oxide is zinc oxide.

22. The white light-emitting apparatus according to claim 20,
wherein the sulfide phosphor particle includes $(Sr_xM_{1-x-y})Ga_2S_4:Eu_y$, where M represents any one of Ca, Mg, and Ba, and x and y satisfy relationships of $0 \leq x \leq 1$ and $0 < y < 0.05$, respectively.

23. The white light-emitting apparatus according to claim 22,
wherein the non-sulfide phosphor particle is $(BaSr)_3SiO_5:Eu$.

24. The white light-emitting apparatus according to claim 23,
wherein the resin for covering the blue light element includes a cured product obtained by polymerizing a photopolymerizable resin.

25. A white illumination apparatus, comprising:
a substrate;
a plurality of blue light-emitting elements arranged on the substrate;
a diffuser plate arranged on the blue light-emitting element the diffuser plate configured to diffuse blue light emitted from the blue light-emitting element; and
a phosphor sheet of which a phosphor layer for converting blue light into white light is provided, is arranged on the diffuser plate, and the phosphor sheet is irradiated with the blue light diffused by the diffuser plate;
wherein the phosphor layer includes
a sheet-shaped resin,
a coated sulfide phosphor particle obtained by coating a sulfide phosphor particle with a silicon dioxide film, containing powders of a sulfur-atom containing gas adsorbent made of a metal oxide, the sulfide phosphor particle including particles of a sulfide fluorescent substance and emitting green light when irradiated with blue light, and
a coated non-sulfide phosphor particle obtained by coating a non-sulfide phosphor particle with a silicon dioxide film, the non-sulfide phosphor particle including particles of a non-sulfide fluorescent substance and emitting red light when irradiated with blue light; and
wherein the sheet-shaped resin contains powders of the coated sulfide phosphor particle.

26. The white illumination apparatus according to claim 25, wherein the silicon dioxide film of the coated non-sulfide phosphor particle contains the powders of the sulfur-atom containing gas adsorbent.

27. The white illumination apparatus according to claim 25, further comprising:
a transparent base material layer disposed on each of an opposed pair of side surfaces of the phosphor layer, each respective of the transparent base layers formed so as to be brought into contact with one respective of the side surfaces of the phosphor layer.

28. The white illumination apparatus according to claim 27,
wherein the phosphor layer has exposed side surfaces.

29. The white illumination apparatus according to claim 27,
wherein the phosphor layer has an outer periphery sealed by a frame so as to prevent the side surfaces of the phosphor layer from being exposed.

30. The white illumination apparatus according to claim 25, wherein the metal oxide is zinc oxide.

31. The white illumination apparatus according to claim 25, wherein the sulfide fluorescent substance is $(Sr_xM_{1-x-y})Ga_2S_4:Eu_y$, where M represents any one of Ca, Mg, and Ba, and x and y satisfy relationships of $0 \leq x \leq 1$ and $0 < y < 0.05$, respectively.

32. The white illumination apparatus according to claim 25, wherein the non-sulfide fluorescent substance is $(BaSr)_3SiO_5:Eu$.

33. The white illumination apparatus according to claim 25,
wherein the sheet-shaped resin is formed by curing a sheet-shaped phosphor particle-containing resin composition including a polymerizable compound through a polymerization reaction of the polymerizable compound.

* * * * *